United States Patent
Watanabe et al.

(10) Patent No.: US 10,672,944 B2
(45) Date of Patent: Jun. 2, 2020

(54) ACTIVE LAYER STRUCTURE, SEMICONDUCTOR LIGHT EMITTING ELEMENT, AND DISPLAY APPARATUS

(71) Applicant: SONY CORPORATION, Tokyo (JP)

(72) Inventors: Yoshiaki Watanabe, Kanagawa (JP); Takayuki Kawasumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 59 days.

(21) Appl. No.: 15/532,094

(22) PCT Filed: Oct. 1, 2015

(86) PCT No.: PCT/JP2015/005008
§ 371 (c)(1),
(2) Date: May 31, 2017

(87) PCT Pub. No.: WO2016/098273
PCT Pub. Date: Jun. 23, 2016

(65) Prior Publication Data
US 2017/0288090 A1 Oct. 5, 2017

(30) Foreign Application Priority Data
Dec. 19, 2014 (JP) .................. 2014-256970

(51) Int. Cl.
*H01L 33/00* (2010.01)
*H01L 33/30* (2010.01)
(Continued)

(52) U.S. Cl.
CPC ......... *H01L 33/0045* (2013.01); *G09G 3/025* (2013.01); *G09G 3/32* (2013.01);
(Continued)

(58) Field of Classification Search
CPC ..... H01L 33/0045; H01L 33/06; H01L 33/14; H01L 33/30; H01L 33/32; G09G 3/025;
(Continued)

(56) References Cited

U.S. PATENT DOCUMENTS

| 6,403,983 B1 | 6/2002 | Mizuno | |
|---|---|---|---|
| 2002/0154664 A1* | 10/2002 | Okubo | B82Y 20/00 372/45.01 |

(Continued)

FOREIGN PATENT DOCUMENTS

| CA | 2302103 A1 | 10/2000 |
|---|---|---|
| CN | 104009391 A | 8/2014 |

(Continued)

OTHER PUBLICATIONS

International Search Report and Written Opinion of PCT Application No. PCT/JP2015/005008, dated Nov. 2, 2015, 02 pages of English Translation and 07 pages of ISRWO.

*Primary Examiner* — Wing H Chow
(74) *Attorney, Agent, or Firm* — Chip Law Group

(57) ABSTRACT

A semiconductor light emitting element includes a first conductive layer, a second conductive layer, and an active layer provided between the first conductive layer and the second conductive layer. The first conductive layer has a current constriction structure, a current injection region being constricted in the current constriction structure. The active layer includes a plurality of quantum well layers, a first light emission wavelength being in a wavelength range of an intensity peak of an entire light emission spectrum, the first light emission wavelength corresponding to a light emission recombination level energy gap of a first quantum well layer of the plurality of quantum well layers, the first quantum well layer being provided at a position closest to the current constriction structure.

8 Claims, 9 Drawing Sheets

(51) Int. Cl.
  *H01L 33/32* (2010.01)
  *H01L 33/06* (2010.01)
  *G09G 3/02* (2006.01)
  *G09G 3/32* (2016.01)
  *G02B 26/10* (2006.01)
  *H01L 33/20* (2010.01)

(52) U.S. Cl.
  CPC .............. *H01L 33/06* (2013.01); *H01L 33/30* (2013.01); *H01L 33/32* (2013.01); *G02B 26/10* (2013.01); *G09G 2320/0233* (2013.01); *H01L 33/20* (2013.01)

(58) Field of Classification Search
  CPC ... G09G 3/32; G09G 2320/0233; G02B 26/10
  See application file for complete search history.

(56) References Cited

U.S. PATENT DOCUMENTS

| | | | | |
|---|---|---|---|---|
| 2004/0036075 | A1* | 2/2004 | Kurahashi | H01L 33/105 257/79 |
| 2007/0153855 | A1* | 7/2007 | Suzuki | B82Y 20/00 372/45.012 |
| 2010/0150194 | A1 | 6/2010 | Tsuchiya et al. | |
| 2013/0208749 | A1* | 8/2013 | Uchida | H01S 5/34 372/45.01 |
| 2013/0259079 | A1* | 10/2013 | Bhattacharya | H01S 5/3013 372/45.01 |
| 2014/0241391 | A1 | 8/2014 | Abe | |

FOREIGN PATENT DOCUMENTS

| | | |
|---|---|---|
| EP | 1045457 A2 | 10/2000 |
| EP | 2770591 A2 | 8/2014 |
| JP | 02-310975 A | 12/1990 |
| JP | 2000-299492 A | 10/2000 |
| JP | 2004-128443 A | 4/2004 |
| JP | 2004-179428 A | 6/2004 |
| JP | 2009-283736 A | 12/2009 |
| JP | 2010-141242 A | 6/2010 |
| JP | 2013-165239 A | 8/2013 |
| JP | 2014-82482 A | 5/2014 |
| JP | 2014-082482 A | 5/2014 |
| JP | 2014-96513 A | 5/2014 |
| JP | 2014-096513 A | 5/2014 |
| JP | 2014-165327 A | 9/2014 |
| TW | 441140 B | 6/2001 |
| WO | 2006/075759 A1 | 7/2006 |
| WO | 2014/051137 A1 | 4/2014 |

* cited by examiner

ACTIVE LAYER STRUCTURE, SEMICONDUCTOR LIGHT EMITTING ELEMENT, AND DISPLAY APPARATUS

CROSS REFERENCE TO RELATED APPLICATIONS

This application is a U.S. National Phase of International Patent Application No. PCT/JP2015/005008 filed on Oct. 1, 2015, which claims priority benefit of Japanese Patent Application No. JP 2014-256970 filed in the Japan Patent Office on Dec. 19, 2014. Each of the above-referenced applications is hereby incorporated herein by reference in its entirety.

TECHNICAL FIELD

The present technology relates to a semiconductor light emitting element, an active layer structure thereof, and a display apparatus including the semiconductor light emitting element.

BACKGROUND ART

As the semiconductor light emitting element, a superluminescent diode (SLD) has characteristics that it has a wide light emission spectrum width relatively close to that of a light emitting diode and emits light with a narrow radiation angle and a high intensity like the light emission state of a semiconductor laser.

The SLD described in Patent Literature 1 includes a linear ridge waveguide formed vertical to a cleavage end surface seen in a plan view, and a curve guide active layer provided so as to bend following the ridge waveguide. On the cleavage end surface, an AR (anti-reflection) film is formed in some cases. In the SLD having such a structure, most of light generated in an active layer located immediately below the linear ridge waveguide travels to the curve guide active layer. The light toward the curve guide active layer is split into light leaked due to the curve, light that is guided to the end surface (end surface on the opposite side of the cleavage end surface) and reflected thereon, and light absorbed while being guided. With such a structure, because the light leaked due to the curve and light reflected on the end surface on the opposite side of the cleavage end surface cannot return to the linear active layer, the laser mode oscillation is suppressed (see, for example, lower right column of p. 2 to upper left column of P. 3, and FIGS. 1A and 1B).

In short, the SLD has not a structure where light is resonated by being reflected on mirrors provided on both end surfaces but a structure where light is amplified by being transmitted through a one-way waveguide (stimulated emission is performed) unlike the normal laser diode (LD). The difference between them is that the spectrum width of the wavelength of output light of the SLD is much larger than that of the LD.

Patent Literature 2 discloses a semiconductor light emitting element (e.g., SLD) used in a fiber optic gyroscope, an optical communication apparatus, an optical application measuring apparatus, and the like. The active layer (luminescent layer) of this semiconductor light emitting element is formed of InGaAs, and includes a plurality of quantum wells including a plurality of barrier layers and a plurality of well layers. It has been known that the quantum efficiency of light emission is improved by providing at least one strained well layer in the plurality of well layers. Specifically, the active layer of the semiconductor light emitting element disclosed in Patent Literature 1 includes a plurality of well layers (a first well layer and a second well layer) in which the composition ratio of the material differs. Accordingly, the structure of the active layer has a different band gap between the first well layer and the second well layer. As a result, with this element, it is possible to achieve wide light emission spectrum characteristics with the center wavelength of approximately 800 nm to approximately 850 nm (see, for example, paragraphs 0082, 0091 to 0098, and 0207, and FIG. 3A).

CITATION LIST

Patent Literature

Patent Literature 1: Japanese Patent Application Laid-open No. 1990-310975
Patent Literature 2: WO 2006/075759

DISCLOSURE OF INVENTION

Technical Problem

Incidentally, in order to expand the application range of such a semiconductor light emitting element, not only the wide spectrum width but also high output is desired to be achieved.

In view of the circumstances as described above, it is an object of the present technology to provide a semiconductor light emitting element, an active layer structure thereof, and a display apparatus including the semiconductor light emitting element that are capable of achieving a wide light emission spectrum width and increasing the output.

Solution to Problem

In order to achieve the above-mentioned object, a semiconductor light emitting element according to the present technology includes a first conductive layer, a second conductive layer, and an active layer.

The first conductive layer has a current constriction structure, a current injection region being constricted in the current constriction structure.

The active layer is provided between the first conductive layer and the second conductive layer, the active layer including a plurality of quantum well layers, a first light emission wavelength being in a wavelength range of an intensity peak of an entire light emission spectrum, the first light emission wavelength corresponding to a light emission recombination level energy gap of a first quantum well layer of the plurality of quantum well layers, the first quantum well layer being provided at a position closest to the current constriction structure.

Since the first light emission wavelength corresponding to the light emission recombination level energy gap of the first quantum well layer located at a position closest to the current constriction structure, of the plurality of quantum well layers provided to the active layer, is in the wavelength range of the intensity peak of the entire light emission spectrum, it is possible to achieve the wide light emission spectrum width and high output.

The active layer may include one or more second quantum well layers and one or more third quantum well layers.

The one or more second quantum well layers have a light emission recombination level energy gap corresponding to a second light emission wavelength longer than the first light emission wavelength.

The one or more third quantum well layers have a light emission recombination level energy gap corresponding to a third light emission wavelength shorter than the first light emission wavelength.

With this configuration, it is possible to increase the light emission spectrum width with the first light emission wavelength as its center while achieving high output.

The active layer may include a plurality of second quantum well layers and a plurality of third quantum wells respectively as the one or more second quantum well layers and the one or more third quantum well layers, the plurality of second quantum well layers having a plurality of different light emission recombination level energy gaps, the plurality of third quantum wells having a plurality of different light emission recombination level energy gaps.

The second quantum well layers and the third quantum well layers may be alternately arranged in a direction away from the first quantum well layer as follows. That is, light emission wavelengths corresponding to the light emission recombination level energy gaps of the plurality of second quantum well layers may be arranged in ascending order from the first light emission wavelength in a spectrum diagram showing a relationship between a light emission wavelength and output, and light emission wavelengths corresponding to the light emission recombination level energy gaps of the plurality of third quantum well layers may be arranged in descending order from the first light emission wavelength in the spectrum diagram.

With this configuration, it is possible to increase the light emission spectrum width while achieving high output.

The plurality of quantum well layers may be configured to have different compositions.

The plurality of quantum well layers may be configured to have different well widths.

An active layer structure according to the present technology is an active layer structure including a first conductive layer having a current constriction structure, a current injection region being constricted in the current constriction structure; a second conductive layer; and an active layer provided between the first conductive layer and the second conductive layer.

The active layer includes a plurality of quantum well layers, a first light emission wavelength being in a wavelength range of an intensity peak of an entire light emission spectrum, the first light emission wavelength corresponding to a light emission recombination level energy gap of a first quantum well layer of the plurality of quantum well layers, the first quantum well layer being provided at a position closest to the current constriction structure.

A display apparatus according to the present technology includes the above-mentioned semiconductor light emitting element; and an image generation unit that is capable of two-dimensionally scanning light emitted from the semiconductor light emitting element and controlling a brightness of the projected light on the basis of image data.

Advantageous Effects of Invention

As described above, in accordance with the present technology, it is possible to achieve the wide spectrum width and high output.

It should be noted that the effect described here is not necessarily limitative and may be any effect described in the present disclosure.

MODE(S) FOR CARRYING OUT THE INVENTION

Hereinafter, embodiments of the present technology will be described with reference to the drawings. In the following description, terms such as "up," "down," "right," and "left" that represent a direction are used to make the description simple, and do not restrict the apparatus or element according to this embodiment.

1. Basic Principle of Semiconductor Light Emitting Element According to this Embodiment (Entire Structure of Semiconductor Light Emitting Element)

Figure 1A:
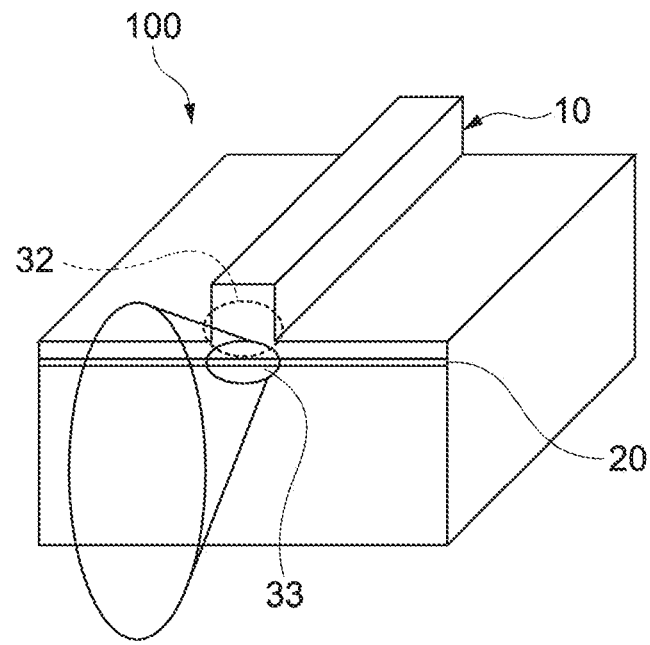
FIG. 1A is a schematic perspective view showing an SLD that is a semiconductor light emitting element according to an embodiment of the present technology.
Figure 1B:
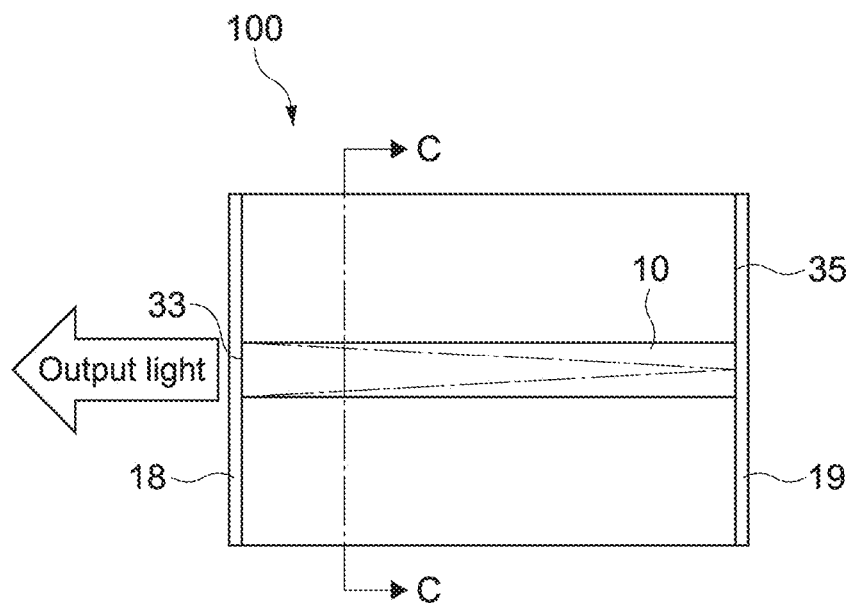
FIG. 1B is a plan view thereof.
Figure 2:
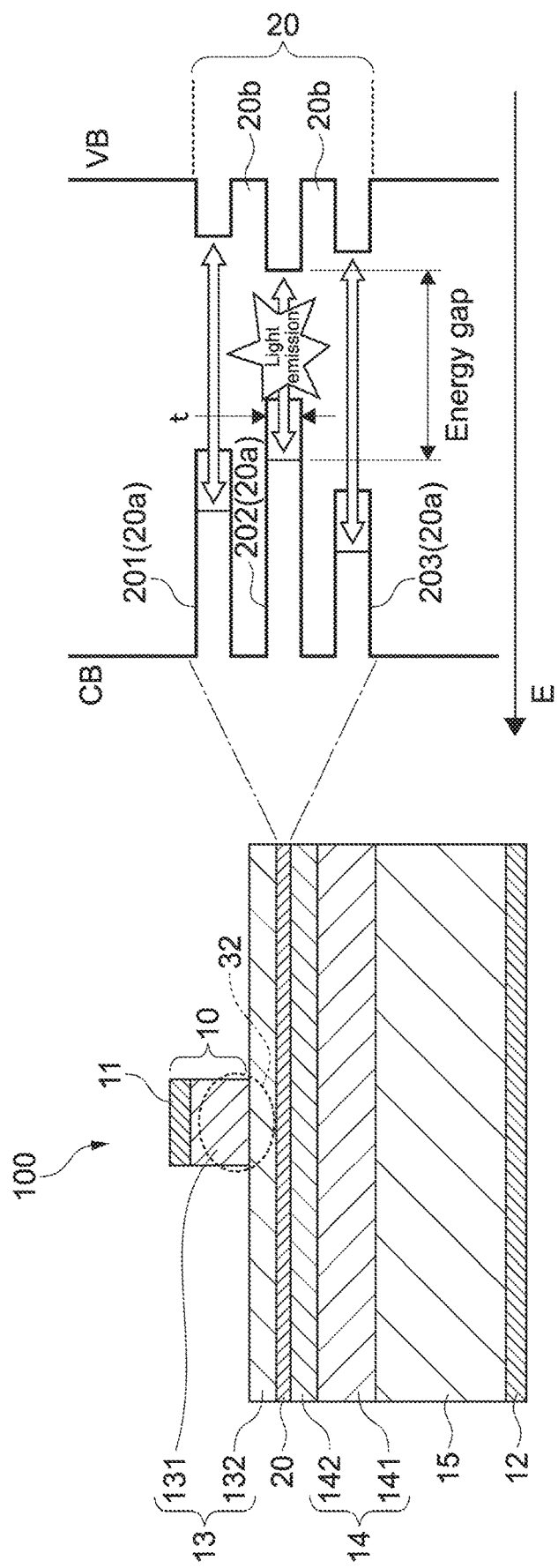
FIG. 2 A left side of FIG. 2 is a cross-sectional view taken along the line C-C in part B of FIGS. 1A and 1B.

FIG. 1A is a schematic perspective view showing a semiconductor light emitting element according to an embodiment of the present technology, and FIG. 1B is a plan view thereof. A left side of FIG. 2 is a cross-sectional view taken along the line C-C in FIG. 1B. This semiconductor light emitting element is, for example, a ridge-type superluminescent diode (SLD) including a ridge portion 10 as a p-type or n-type conductive layer.

An SLD 100 includes a p-type electrode layer (or a contact layer that is in contact with a p-type electrode layer (not shown)) 11, a first conductive layer 13 that is a p-type semiconductor layer, an active layer 20, a second conductive layer 14 that is a n-type semiconductor layer, an n-type semiconductor substrate 15, an n-type electrode layer (or a contact layer that is in contact with an n-type electrode layer (not shown)) 12, from top in the left side of FIG. 2.

The first conductive layer 13 includes a p-type cladding layer 131 and a p-type guide layer 132 formed in order from the side of the p-type electrode layer 11. The second conductive layer 14 includes an n-type guide layer 141 and an n-type cladding layer 142 formed in order from the side of the substrate 15. For example, the p-type electrode layer 11 and the p-type cladding layer 131 constitute the ridge portion 10. Between the substrate 15 and the second conductive layer 14, an n-type buffer layer may be provided.

The ridge portion 10 is linearly formed along a direction vertical to a light emission end surface 33, for example. The first conductive layer 13 has a current constriction structure 32. Specifically, with the structure of the ridge portion 10, the current constriction structure 32 configured so that the current injection region from the p-type electrode layer 11 to the active layer 20 is constricted is formed. Accordingly, in the vicinity of the ridge portion 10 in the active layer 20, a light waveguide along the longitudinal direction of the ridge portion 10 is formed.

On the p-type guide layer 132 or around the ridge portion 10, an insulation layer (not shown) is formed.

Note that although the lower end of the p-type cladding layer 131 corresponds to the lower end of the ridge portion 10, it does not necessarily need to correspond thereto, and the lower end of the ridge portion 10 may include a part of the p-type guide layer 132.

As shown in FIG. 1B, a low reflection mirror film 18 is provided on the light emission end surface 33 of the SLD 100, and a high reflection mirror film 19 is provided on an end surface 35 on the opposite side thereof. Among light spontaneously emitted from the active layer 20, the light toward the side of the high reflection mirror film 19 is reflected on the high reflection mirror film 19, amplified on the way to the side of the light emission surface, and emitted via the low reflection mirror film 18.

(Structure of Active Layer)

Next, an active layer structure according to this embodiment will be described. The right side of FIG. 2 schematically shows the band structure of the active layer 20. The horizontal direction represents energy, and the energy is higher toward the left side. The vertical direction represents the lamination direction of the layers constituting the SLD 100. The band on the side where the energy is low is a valence band and the band on the side where the energy is high is a conductance band.

This active layer 20 includes a plurality of quantum well layers 20a, i.e., is a multiple quantum well active layer 20. Specifically, the active layer 20 includes the plurality of quantum well layers 20a and one or more barrier layers 20b arranged between them. The plurality of quantum well layers 20a actually include a plurality of active layer thin films (thin films corresponding to quantum well layers). In the left side of FIG. 2, the plurality of active layer thin films are not shown, and represented as one active layer 20.

A width t (hereinafter, referred to simply as well width) of the quantum well layers 20a corresponds to the thickness of the active layer thin film. Further, the one or more barrier layers 20b actually include one or more barrier thin films. The well width of each quantum well layer 20a is substantially the same.

One quantum well layer 20a of the plurality of quantum well layers 20a, which is provided at a position closest to the current constriction structure 32, i.e., the ridge portion 10, is referred to as the first quantum well layer 201 in the following. The active layer 20 is configured so that the light emission wavelength (hereinafter, referred to as the first light emission wavelength) corresponding to the light emission recombination level energy gap of the first quantum well layer 201 is in a wavelength range of an intensity peak of the light emission spectrum of the SLD 100 (entire light emission spectrum of SLD 100).

Specifically, the active layer 20 includes one or more quantum well layers (hereinafter, referred to as the second quantum well layers) 202 having a light emission recombination level energy gap corresponding to a second light emission wavelength longer than the first light emission wavelength, of the plurality of quantum well layers 20a. Further, the active layer 20 includes one or more quantum well layers (hereinafter, referred to as the third quantum well layers) 203 having a light emission recombination level energy gap corresponding to a second light emission wavelength shorter than the first light emission wavelength, of the plurality of quantum well layers 20a. Specifically, the light emission recombination level energy gap of each second quantum well layer 202 is smaller than that of the first quantum well layer 201, and the light emission recombination level energy gap of each third quantum well layer 203 is larger than that of the first quantum well layer 201. Note that in the right side of FIG. 2, the band structure of the active layer in which one second quantum well layer 202 and one third quantum well layer 203 are provided is shown to make the description simple.

Figure 3:
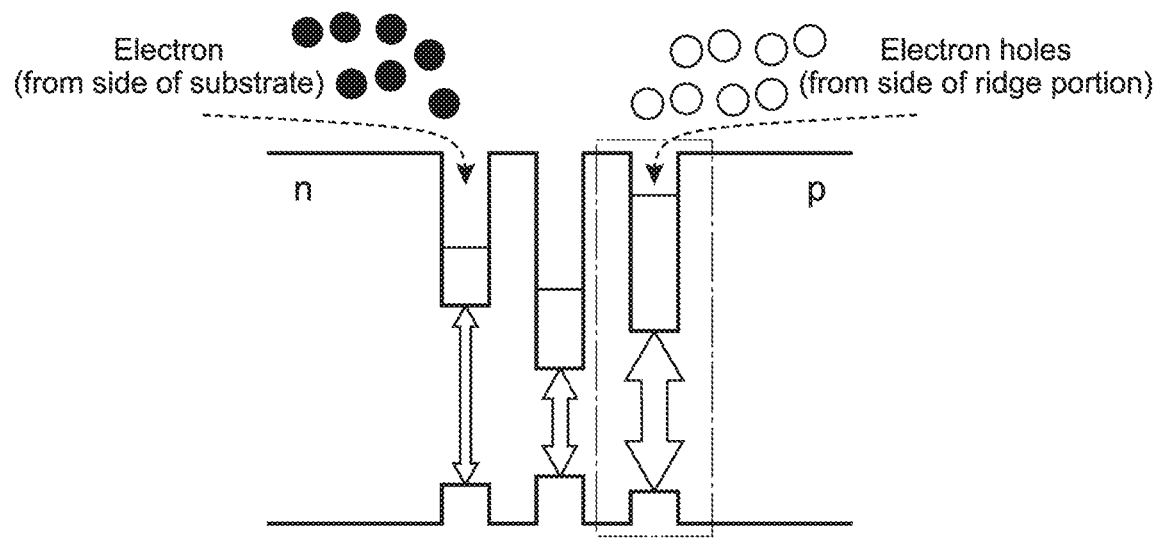
FIG. 3 schematically shows the state where the most carriers are injected into a first quantum well layer located at a position closest to a ridge portion.

As shown in FIG. 3, there are characteristics that the most carrier (here, electron holes) are injected into the first quantum well layer 201 located at a position closest to the ridge portion 10. The active layer is configured so that the light emission wavelength of the first quantum well layer 201 corresponds to the wavelength range of the intensity peak of the entire light emission spectrum. Accordingly, it is possible to achieve light emission of as high output as possible.

Note that although it is shown that electron holes are injected from the conduction band in FIG. 3, this is to make the figure simple, and electron holes are originally injected from the valence band.

Figure 4:
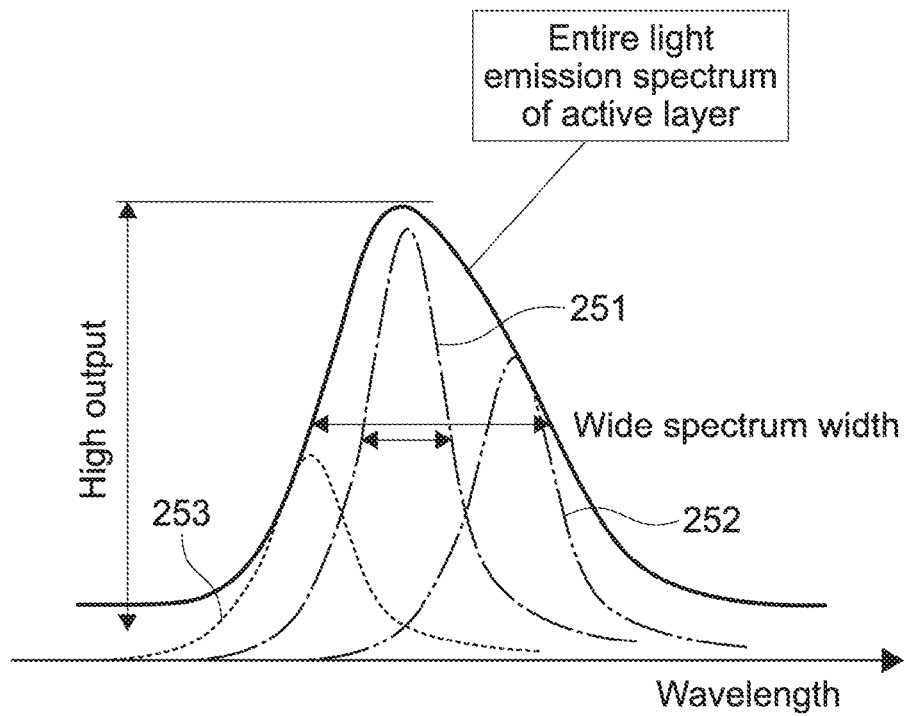
FIG. 4 shows the shape of an entire light emission spectrum of an SLD and the shape of the light emission spectrum of each quantum well layer.

FIG. 4 shows the shape of an entire light emission spectrum of the active layer 20 and the shape of the light emission spectrum of each quantum well layer 20a. In FIG. 4, the vertical direction shows output (which may be an intensity or gain). Light having characteristics denoted by a reference numeral 251 is light having the first light emission wavelength in a wavelength range of an intensity peak. Light having characteristics denoted by a reference numeral 252 is light having the second light emission wavelength longer than the first light emission wavelength. Light having characteristics denoted by a reference numeral 253 is light having the third light emission wavelength shorter than the first light emission wavelength. The active layer 20 of the SLD 100 is capable of emitting light having a light emission spectrum including these three wavelength range, for example.

As described above, in the active layer structure according to this embodiment, it is possible to achieve the wide light emission spectrum width and high output (high gain).

Examples of the material of the active layer 20 include the following materials. In the bracket, the wavelength range (wavelength range including an intensity peak or center wavelength) is shown.

AlGaN (ultraviolet region to 400 nm)

InGaN (400 to 1000 nm, the practical area is 400 to 550 nm and blue violet to green)

AlGaInP (550 to 900 nm, the practical region is 630 to 680 nm and red)

AlGaAs (750 to 850 nm, infrared region)

InGaAs (800 to 980 nm, infrared region)

InGaAsP (1.2 to 1.6 μm, infrared region)

(Regarding Difficulty of Achieving Wide Spectrum Width and High Output)

In order to achieve light of high output, the following means: 1) injecting a large amount of current into the SLD; 2) increasing the length of the light waveguide; and 3) increasing the ridge width are conceivable, for example. However, these means have the following problems.

In the case of 1) injecting a large amount of current, in order to achieve high output, the heat dissipation burden on the package of the SLD is increased, which is a cause of cost increase, because the upper limit is restricted by the thermal saturation of output. Further, in the case where a large amount of current is injected, because the SLD is easy to oscillate even with slight end surface reflection, it needs to cause the SLD to operate with current significantly lower than the current at the time of the above-mentioned thermal saturation.

In the case of 2) increasing the length of the light waveguide, because light is amplified in a longer path before the light is taken out to the outside, the intensity of light is increased, but there are the following disadvantages.

One disadvantage is that the amplification of light by stimulated emission is facilitated, which affects the shape of the light emission spectrum. Specifically, the light emission spectrum width is reduced as the length of the light waveguide, i.e., the length of a path in which light can be amplified is increased. Therefore, the low coherence is reduced (interference is easy to occur). In other words, the low coherence and the output are in a trade-off relationship.

Another disadvantage is that the size of semiconductor light emitting element is increased, which is unsuitable for size reduction of the package, and the entire waveguide loss is increased, which is likely to reduce the light conversion efficiency.

In the case of 3) increasing the ridge width, it is possible to increase the output by reducing the density of concentrated current and increasing the area of light emission. However, the width of the beam to be output is increased by the amount corresponding thereto, and the light source is difficult to use on applications. Therefore, also the ridge width has an upper limit. Further, it is also a problem that the number of modes that can be guided is increased by increasing the ridge width.

4) As another method of achieving light of high output, a method of increasing the spectrum width when light is spontaneously emitted before the light is amplified is conceivable. However, in order to achieve this, it needs to change the design, e.g., separate the injecting electrode in the corresponding light emission region, or change only the region to be made of a different active layer material or to have a different active layer structure. In the former case, it needs to separate electrodes and drive them with separate drivers, and the structure is not economical. In the latter case, because the structure is very difficult to make, e.g., the crystal needs to be regrown, it costs a lot. In the first place, in these two methods, the efficiency of the light source is further reduced because current to be consumed is basically likely to be increased.

(Summary)

With the SLD 100 according to this embodiment, it is possible to ensure high output by placing the first light emission wavelength of the first quantum well layer 201 having highest efficiency of carrier injection on the center of the light emission spectrum width of the SLD 100. Furthermore, it is possible to achieve the wide spectrum width and high output by causing other quantum well layers to play a role in increasing the spectrum width. This represents that the problem of the above-mentioned "trade-off relationship between the low coherence and the output" is overcome.

Further, the active layer 20 according to this embodiment includes the second quantum well layers 202 having a light emission recombination level energy gap corresponding to the second light emission wavelength longer than the first light emission wavelength, and the third quantum well layers 203 having a light emission recombination level energy gap corresponding to the third light emission wavelength shorter than the light emission wavelength corresponding to the light emission recombination level energy gap of the first quantum well layer 201. Accordingly, it is possible to increase the light emission spectrum width with the first light emission wavelength as its center while achieving high output.

Figure 5A:
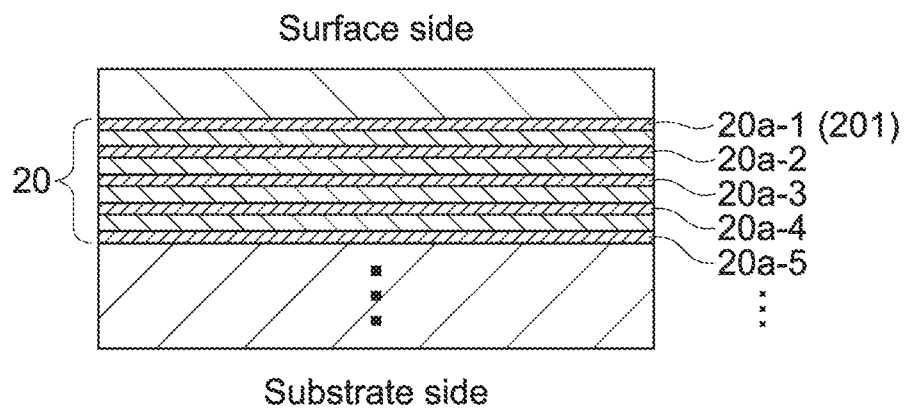
FIG. 5A shows an active layer structure including five or more quantum well layers.

It goes without saying that the number of quantum well layers 20a of the active layer 20 is not limited to three, and may be four or more. Specifically, three or more quantum well layers other than the first quantum well layer 201 may be provided. For example, a plurality of second quantum well layers 202 and a plurality of third quantum well layers 203 may be provided. As shown in FIG. 5A, the number of quantum well layers 20a-2, 20a-3, 20a-4, 20a-5, . . . other than the first quantum well layer 201 closest to the current constriction structure 32 (see the left side of FIG. 2) is favorably four or more. The total number of quantum well layers 20a is 5 to 30, and favorably, 10 to 20.

Figure 5B:
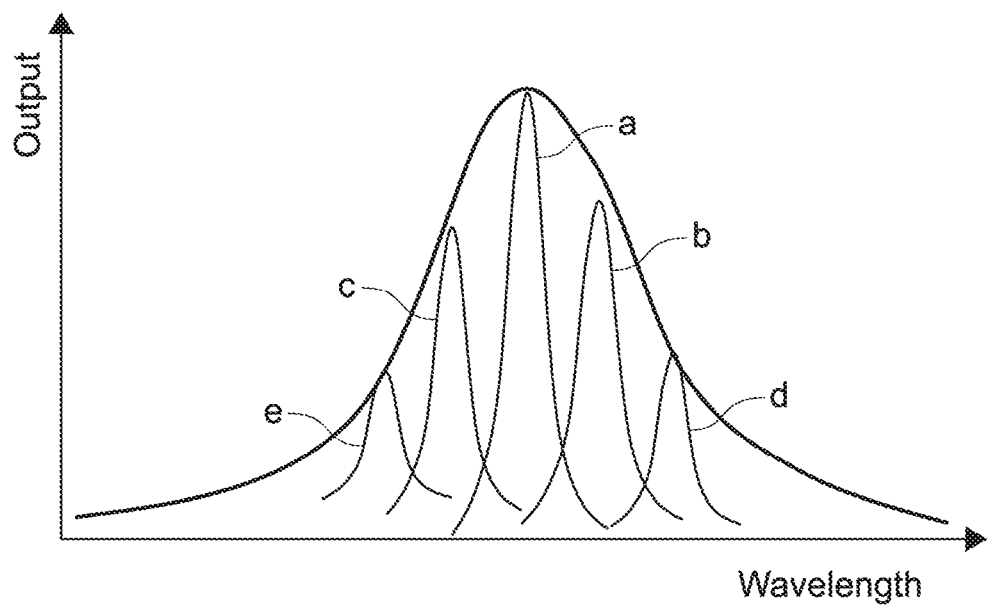
FIG. 5B shows the light emission spectrum thereof.

Specifically, the quantum well layers 20a-2, 20a-4, . . . are alternately arranged in a direction away from the first quantum well layer 201 so that the light emission wavelengths longer than the first light emission wavelength are arranged in ascending order from the first light emission wavelength in the spectrum diagram shown in FIG. 5B. In FIG. 5B, the light emission spectrum of the first quantum well layer 201 (20a-1) is denoted by a reference symbol a. The light emission spectrum of the quantum well layer 20a-2 is denoted by a reference symbol b, and the light emission spectrum of the quantum well layer 20a-4 is denoted by a reference symbol d.

On the other hand, the quantum well layers 20a-3, 20a-5, . . . are alternately arranged in a direction away from the first quantum well layer 201 so that the light emission wavelengths shorter than the first light emission wavelength are arranged in descending order from the first light emission wavelength. In FIG. 5B, the light emission spectrum of the quantum well layer 20a-3 is denoted by a reference symbol c, and the light emission spectrum of the quantum well layer 20a-5 is denoted by a reference symbol e.

With such a structure of the active layer 20, it is possible to further increase the light emission spectrum width while achieving high output.

Further, with the active layer structure according to this embodiment, it is possible to linearly form the current injection region (the ridge portion 10 in this embodiment) of the current constriction structure 32. Specifically, it does not need to form the above-mentioned curved ridge portion described in Patent Literature 1, and it is possible to ensure the easiness of design and manufacturing and reduce the cost. Further, it is also possible to use the existing design as it is for the design of layers other than the active layer 20.

At least two of the plurality of quantum well layers 20a may have the same light emission recombination level energy gap. This shall apply also to the first quantum well layer 201 provided at a position closest to the current constriction structure 32. That is, also the light emission recombination level energy gap of the quantum well layer provided at a position second closest to the current constriction structure 32 may have the same light emission recombination level energy gap as that of the quantum well layer provided at a position closest to the current constriction structure 32.

Further, in accordance with this embodiment, "a thin quantum well layer" having a high quantum effect can be used, and effective use of carriers is facilitated. Accordingly, it is possible to achieve not only the above-mentioned high output and wide spectrum width but also improvement of temperature characteristics. This "temperature characteristics" will be described later.

(Example of More Specific Verification and Effects of Active Layer According to this Embodiment)

Figure 6:
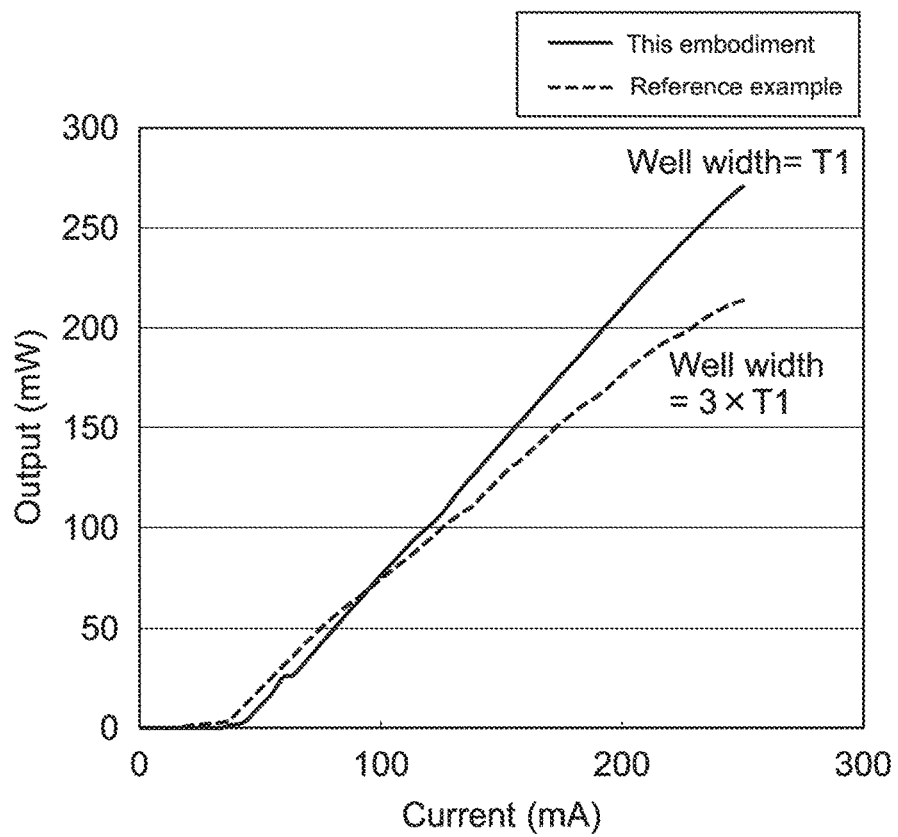
FIG. 6 shows the simulation results of the improving effects of output depending on injected current.

FIG. 6 shows the simulation results of the improving effects of output depending on injected current. In FIG. 6, the graph represented by a solid line is obtained by the active layer structure according to this embodiment, in which the material of the active layer is AlGaInP, and the active layer structure includes three quantum well layers with a thin well width T1. The difference of the light emission recombination level energy gap is ± several nm from the central wavelength. On the other hand, the graph represented by broken lines is obtained by an active layer structure according to a reference example, in which the material and length of the light waveguide are the same as those in the case represented by a solid line, and the active layer structure includes one quantum well layer with a thick well width (3×T1).

From this result, it is seen that the output is improved by 20 to 30% in the region of high current injection, and the SLD 100 according to this embodiment is capable of effectively using the quantum effects. Although the output starts to be saturated in the region of the maximum current in the case of the active layer structure according to the reference example, the output is not saturated in the active layer structure according to this embodiment. Therefore, it is expected that the difference between the output of the active layer structure according to this embodiment and the output of the active layer structure according to the reference example is further increased in the region of current larger than this maximum current. Specifically, in this embodiment, because also the high current operation at the time when the semiconductor light emitting element itself is in a high temperature state is improved, also the operation at high temperature is superior to the reference example. Specifically, as described above, "the temperature characteristics" are improved.

Figure 7:
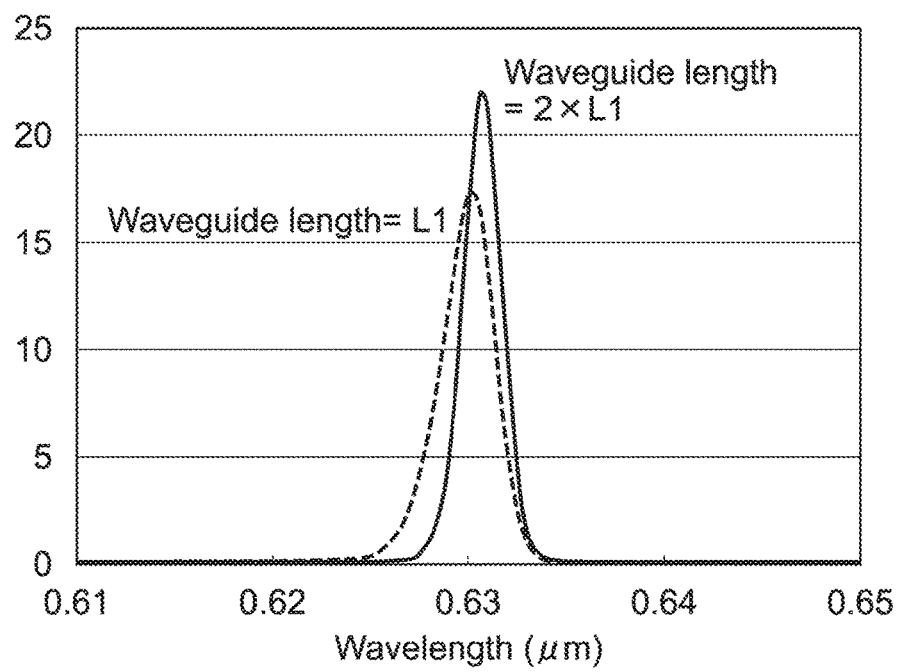
FIG. 7 shows the simulation results of the improving effect of the spectrum width.

FIG. 7 shows the simulation results of the improving effect of the spectrum width. In the vertical axis of the graph, the output is standardized. Both of broken lines and a solid line represent the graph of the active layer structure according to this embodiment. The broken lines represent the graph showing the characteristics of the active layer structure having a light waveguide length L1. The solid line represents the graph showing the characteristics of the active layer structure in the case where only the length of the light waveguide is twice as long as the above-mentioned reference (the light waveguide length 2×L1). From this result, it is seen that the spectrum width of 83% with a full width at half maximum can be kept even if the length of the light waveguide is doubled to increase the output.

On the other hand, regarding the active layer structure according to the reference example (including one quantum well layer with the above-mentioned well width 3×T1 nm), the results obtained by comparing the active layer structure having the light waveguide length L1 (reference example 1) with the active layer structure having a light waveguide length 2×L1 (reference example 2) are as follows. Specifically, the spectrum width of the active layer structure according to the reference example 2 is reduced by up to 55% with a full width at half maximum as compared with the active layer structure according to the reference example 1. Accordingly, it is seen that the improving effect of the spectrum width in the active layer structure according to this embodiment in which the spectrum width of 85% with a full width at half maximum can be kept is very high.

On the other hand, when the difference between the light emission wavelengths of the plurality of quantum well layers is too large, there are concerns that the peak is divided or the waveguide mode is affected. However, it is considered that when the difference is approximately several nm, for example, it works out as calculated and such a problem does not occur. Therefore, it is considered that there is no practical problem even when the entire light emission spectrum width is 10 nm or more by further increasing the number of quantum well layers, for example.

In order to further improve the characteristics of the active layer 20, it is desired that carriers are effectively used by further reducing the thickness of the active layer thin film, and the thickness of the active layer thin film is reduced as thin as possible to the level that the crystallinity is not lost on the epitaxial process.

The SLD 100 according to this embodiment can be a product with reliability equivalent to that of an LD because the SLD 100 employs a multiquantum well structure that is used also in the LD. Further, improvement of light emission efficiency with the multiquantum well structure leads also to improvement of energy efficiency.

In this embodiment, there is a possibility of achieving light emission with lower coherency with high efficiency by appropriately arranging quantum well layers as long as low output is acceptable in the application. For example, it is possible to easily achieve the light emission spectrum width of approximately 10 nm without extremely reducing the length of the light waveguide, for example.

Also in a light amplifier with an operating principle similar to that of the SLD, similar effects are expected to be achieved. That is, in a light amplifier with a structure equivalent to the active layer structure according to this embodiment, it is expected that the amplification wavelength range can be increased and the amplification efficiency can be improved.

2. Specific Means for Achieving Active Layer Structure According to this Embodiment Example 1 of Specific Means As a means for achieving the above-mentioned structure of the active layer 20, for example, the active layer 20 only needs to be configured so that the composition of the material of each active layer thin film (thin films constituting the quantum well layers 20*a*) differs. With such a structure, it is possible to achieve the active layer 20 including the plurality of quantum well layers 20*a* having different light emission recombination level energy gaps.

Figure 8:
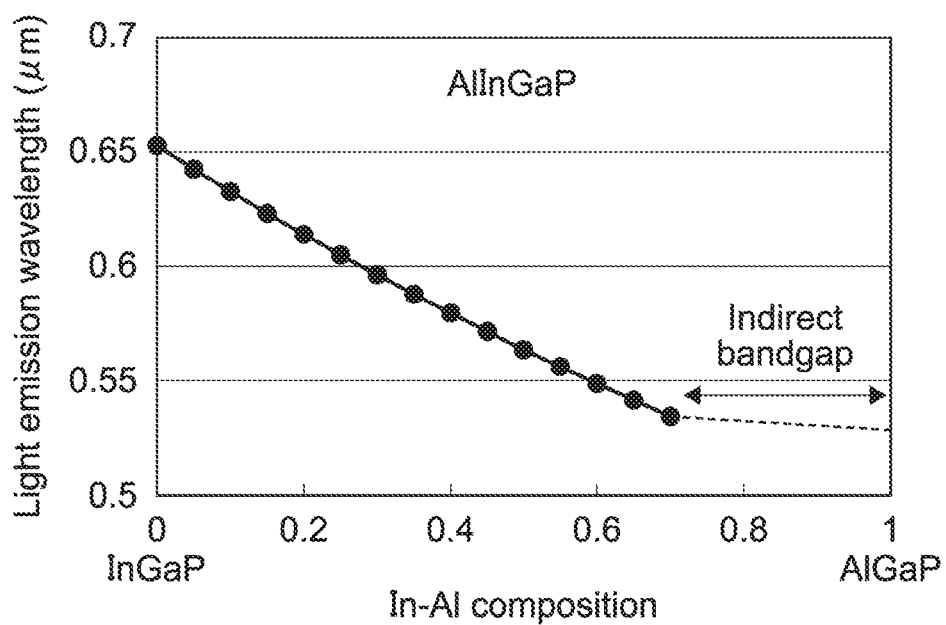
FIG. 8 is a graph showing the calculation results of the light emission wavelength corresponding to a band gap in the case where the composition of an active layer thin film is changed.

FIG. 8 is a graph showing the calculation results of the light emission wavelength corresponding to a band gap in the case where the composition of an active layer thin film is changed. The horizontal axis represents, for example, the composition of In and Al (referred to also as composition ratio) in AlGaInP. In the horizontal axis, the composition of In is reduced as the composition of Al is increased in AlGaInP. When the composition of Al is 0.5, the composition of In is also 0.5. Note that when the composition of Al is not less than 0.7, a band structure with an indirect bandgap is shown.

As described above, because the composition of the active layer thin film differs, it is possible to achieve light emission wavelengths corresponding to various light emission recombination level energy gaps.

Note that the example shown in FIG. 8 is obtained from the active layer structure configured so that the composition of Al and In in the composition of AlGaInP that is capable of emitting red light differs. However, other than the composition of Al and In, the composition of at least one material in the composition of AlGaInP may differ. This shall apply also to the above-mentioned GaN-based and GaAs-based active layers.

Figure 11:
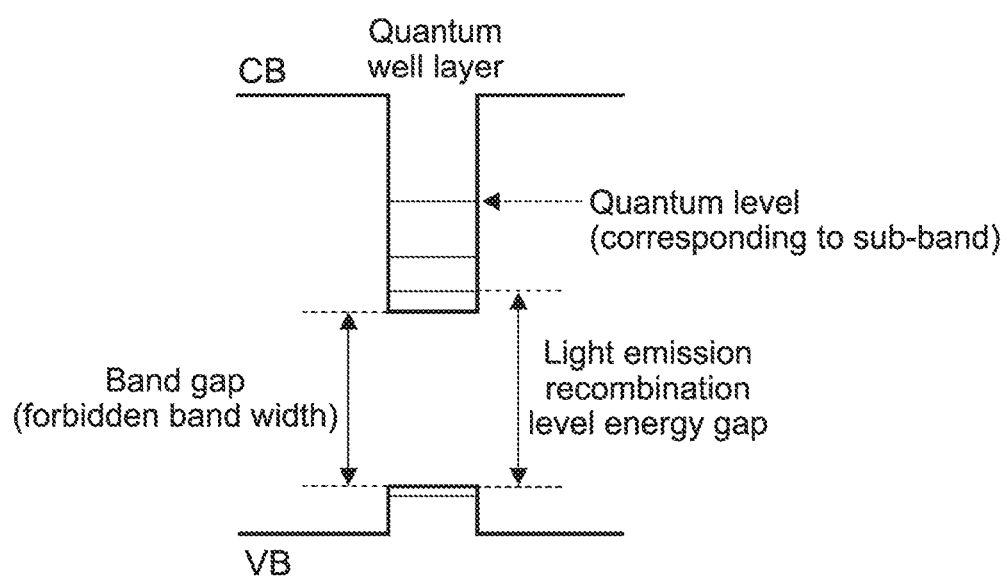
FIG. 11 is a diagram for describing the difference between an energy gap and a light emission recombination level energy gap.

Now, the difference between "the light emission recombination level energy gap" and "the band gap (forbidden band width)" will be described. As shown in FIG. 11, the band gap is an energy gap where recombination occurs across the gap and light is emitted when the active layer has a relatively large thickness and there is substantially no quantum effect. On the other hand, the light emission recombination level energy gap is an energy gap where a sub-band is formed at the quantum level shown in FIG. 11, recombination occurs on this sub-band, and light is emitted, when the active layer is quantized. The band gap represents a value determined mainly by the material of the active layer, and the light emission recombination level energy gap represents a value determined by the material of the active layer and the well width.

Example 2 of Specific Means

Figure 9A:
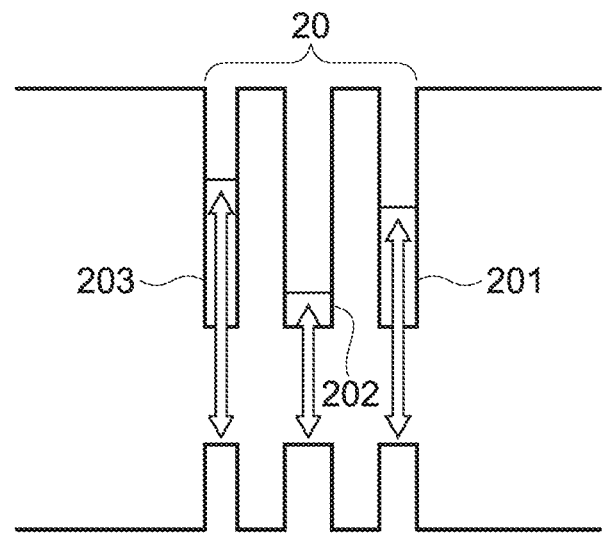
FIG. 9A shows a band structure of an active layer structure configured so that well widths of quantum well layers corresponding to a plurality of active layer thin films differ.

As another means for achieving the above-mentioned structure of the active layer, FIG. 9A shows the band structure of the active layer 20 configured so that the well widths of the quantum well layer (the first quantum well layer) 201, the second quantum well layer 202, and the third quantum well layer 203 corresponding to a plurality of active layer thin films differ. The active layer structure according to this embodiment is configured so that the well width of the quantum well layer corresponding to each active layer thin film differs. Since the well widths differ, it is possible to achieve the active layer 20 including the plurality of quantum well layers 201, 202, and 203 having different light emission recombination level energy gaps.

Figure 9B:
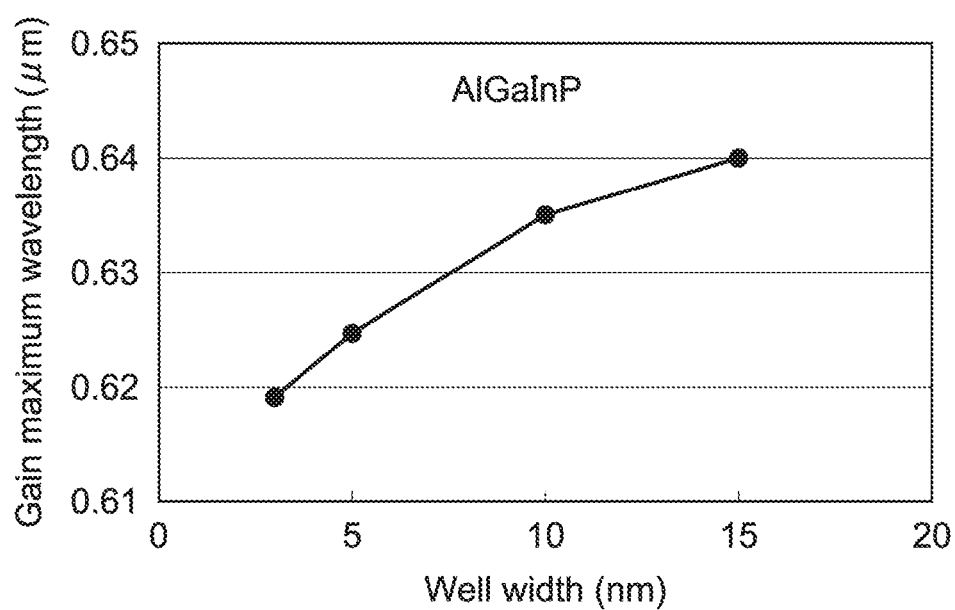
FIG. 9B is a graph showing the calculation results of the gain maximum wavelength in the case where the well width of the quantum well layer is changed.

FIG. 9B is a graph showing the calculation results of the gain maximum wavelength in the case where the well width of the quantum well layer is changed. As the material of the active layer, AlGaInP is used. Note that "the gain maximum wavelength" is substantially a light emission wavelength corresponding to a light emission recombination level energy gap.

As can be seen from FIG. 9B, since the well widths of the quantum well layers differ, it is possible to achieve the active layer structure configured so that the light emission wavelength differs.

The technology in this example can be similarly applied also to the above-mentioned GaN-based and GaAs-based active layer made of materials other than AlGaInP that is capable of emitting red light.

Note that the structure shown in FIGS. 9A and 9B does not necessarily need to be employed, and the number of quantum well layers may be four or more (e.g., 5 to 30, favorably, 10 to 20), and at least two of them may have the same well width, similarly to the above.

(Example of Specific Effects of Above Examples 1 and 2 of Specific Means)

Because the SLD 100 according to this embodiment can be produced only by changing a part of conditions in the epitaxial growth, the entire process is hardly affected.

The composition of the active layer can be detected by analysis with a TEM (Transmission Electron Microscope) followed by EDX (Energy Dispersive X-ray) analysis or WDX (Wavelength Dispersive X-ray) analysis. In particular, because the latter has detection performance (not more than 0.1%) sufficient to be capable of detecting the composition difference (approximately 1%) by which a clear wavelength difference is generated, it is fully possible to perform analysis.

3. Display Apparatus

Figure 10:
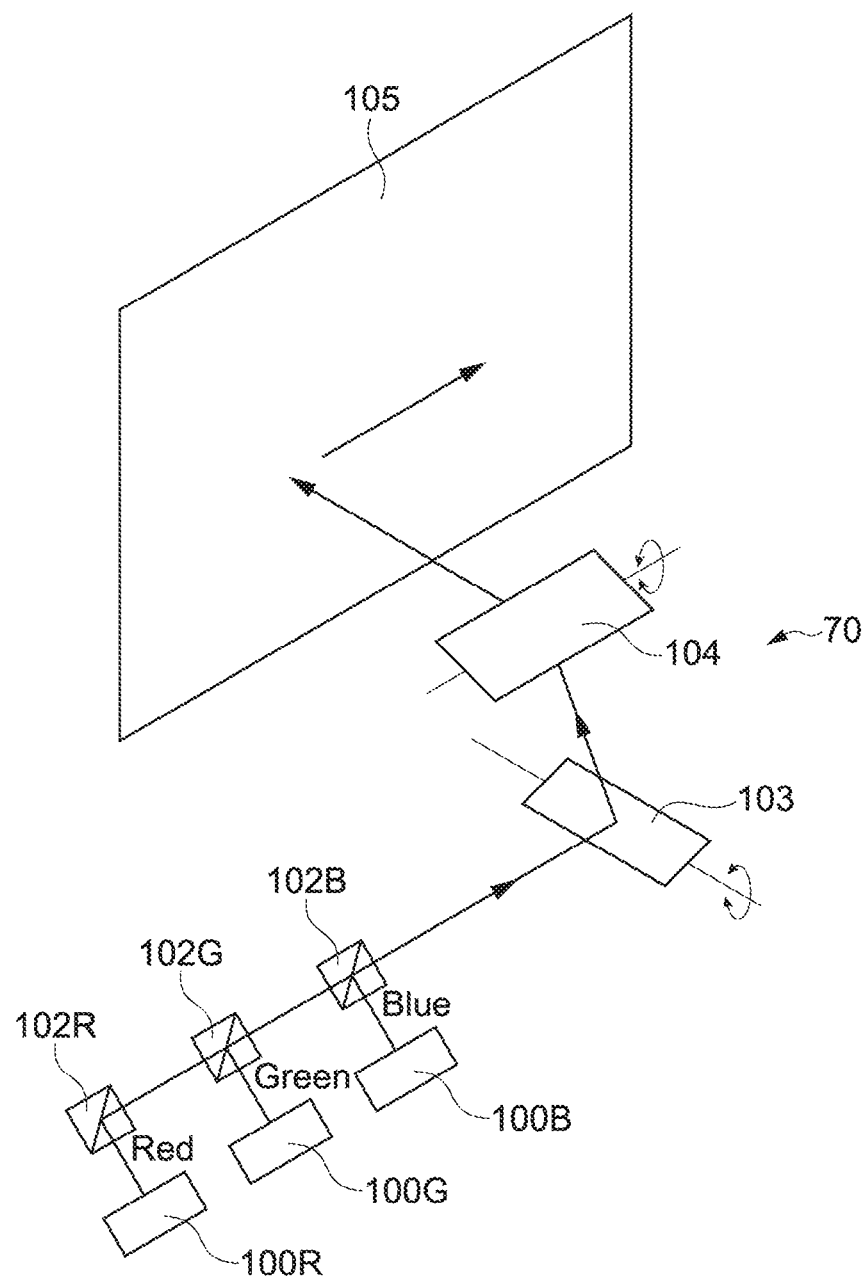
FIG. 10 schematically shows the configuration of a display apparatus that uses the semiconductor light emitting element according to any one of the above-mentioned embodiments as a light source.

FIG. 10 schematically shows the configuration of a display apparatus that uses the SLD that is the semiconductor light emitting element according to the above-mentioned embodiments as a light source. This display apparatus 200 is a projector that uses a raster scanning method.

The display apparatus 200 includes an image generation unit 70. The image generation unit 70 is configured to be capable of two-dimensionally scanning, e.g., performing raster scanning on light emitted from a semiconductor light emitting element as a light source, and controlling the brightness of light projected on an irradiated surface 105 such as a screen and a wall surface on the basis of image data.

The image generation unit 70 mainly includes a horizontal scanner 103 and a vertical scanner 104, for example. Beams emitted from a red light emission SLD 100R, a green light emission SLD 100G, and a blue light emission SLD 100B are collected into one beam by dichroic prisms 102R, 102G, and 102B, respectively. This beam is scanned by the horizontal scanner 103 and the vertical scanner 104 and projected on the irradiated surface 105, thereby displaying an image.

Note that at least one of the semiconductor light emitting elements that emit RGB color light only needs to be an SLD, and other elements may be normal LDs.

The horizontal scanner 103 and the vertical scanner 104 may each be configured by the combination of a polygon mirror and a Galvano scanner, for example. In this case, as a means for controlling the brightness, a circuit that controls current injected into a semiconductor light emitting element is used, for example.

Alternatively, as the horizontal scanner and the vertical scanner, a two-dimensional light modulation element such as a DMD (Digital Micro-mirror Device) manufactured by a MEMS (Micro Electro Mechanical System) technology may be used.

Alternatively, the image generation unit 70 may be configured by the combination of a one-dimensional light modulation element such as a GLV (Grating Light Valve) element and the above-mentioned one-dimensional scanning mirror.

Alternatively, the image generation unit 70 may include a refractive index modulation type scanner such as an acoustooptic effect scanner and an electro-optic effect scanner.

4. Other Various Embodiments

The present technology is not limited to the abovementioned embodiments, and other various embodiments can be achieved.

Other than the structure where the composition of the active layer thin film and the well width differ as described above, the semiconductor light emitting element having different light emission wavelengths can be achieved also by the following active layer structures. For example, the active layer structure may be configured so that the direction of distortion that occurs in the quantum well layer and/or the distortion rate differ by causing the composition of the material of each barrier layer between the active layer thin films and the thickness thereof to differ.

Alternatively, also with the dopant concentration of the quantum well layer, it is possible to achieve the active layer structure having a plurality of light emission wavelengths.

Although the number of quantum well layers of the active layer structure according to the above-mentioned embodiments is three or more, it may be two.

The current constriction structure 32 configured so that the current injection region is constricted is not limited to the structure forming the ridge portion 10. For example, the current constriction structure may be an embedding structure or embedding ridge structure.

Although an n-type substrate has been used as the substrate 15 in the above-mentioned embodiments, a p-type substrate may be used and a semiconductor layer constituting the current constriction structure may be an n-type one. In this case, "the first conductive" is n-type, and "the second conductive" is p-type.

The semiconductor light emitting element according to the above-mentioned embodiments has had a structure where the current constriction structure 32 is located on the opposite side of the substrate 15 from the active layer 20. However, the current constriction structure may be located on the same side of a (n-type or p-type) substrate from the active layer 20. Note that the semiconductor light emitting element according to the above-mentioned embodiments has a merit of having high heat radiation property on the structure as compared with the semiconductor light emitting element having a structure where the current constriction structure is located on the same side as that of the substrate.

The number of first quantum well layers 201 having a light emission recombination level energy gap corresponding to a peak light emission wavelength may be two or more. In this case, these first quantum well layers 201 are sequentially arranged in order from the position closest to the current constriction structure 32. Similarly, a plurality of second quantum well layers having the same light emission recombination level energy gap and/or a plurality of third quantum well layers having the same light emission recombination level energy gap may be provided.

In the embodiment shown in FIGS. 3 and 4, the quantum well layer second closest to the current constriction structure 32 after the first quantum well layer 201 has been described as the second quantum well layer 202 having a light emission wavelength longer than the first light emission wavelength. However, the quantum well layer second closest to the current constriction structure 32 after the first quantum well layer 201 may be the third quantum well layer 203 having a light emission wavelength shorter than the first light emission wavelength.

At least two features of the features of the above-mentioned embodiments may be combined.

It should be noted that the present technology may take the following configurations.

(1)
A semiconductor light emitting element, including:
a first conductive layer having a current constriction structure, a current injection region being constricted in the current constriction structure;
a second conductive layer; and
an active layer provided between the first conductive layer and the second conductive layer, the active layer including a plurality of quantum well layers, a first light emission wavelength being in a wavelength range of an intensity peak of an entire light emission spectrum, the first light emission wavelength corresponding to a light emission recombination level energy gap of a first quantum well layer of the plurality of quantum well layers, the first quantum well layer being provided at a position closest to the current constriction structure.

(2)
The semiconductor light emitting element according to claim 1, in which
the active layer includes
one or more second quantum well layers, the one or more second quantum well layers having a light emission recombination level energy gap corresponding to a second light emission wavelength longer than the first light emission wavelength, and
one or more third quantum well layers, the one or more third quantum well layers having a light emission recombination level energy gap corresponding to a third light emission wavelength shorter than the first light emission wavelength.

(3)
The semiconductor light emitting element according to claim 2, in which
the active layer includes a plurality of second quantum well layers and a plurality of third quantum wells respectively as the one or more second quantum well layers and the one or more third quantum well layers, the plurality of second quantum well layers having a plurality of different light emission recombination level energy gaps, the plurality of third quantum wells having a plurality of different light emission recombination level energy gaps, and
the second quantum well layers and the third quantum well layers are alternately arranged in a direction away from the first quantum well layer, light emission wavelengths corresponding to the light emission recombination level energy gaps of the plurality of second quantum well layers being arranged in ascending order from the first light emission wavelength in a spectrum diagram showing a relationship between a light emission wavelength and output, light emission wavelengths corresponding to the light emission recombination level energy gaps of the plurality of third quantum well layers being arranged in descending order from the first light emission wavelength in the spectrum diagram.

(4)
The semiconductor light emitting element according to any one of claims 1 to 3, in which
the plurality of quantum well layers are configured to have different compositions.

(5)
The semiconductor light emitting element according to any one of claims 1 to 3, in which
the plurality of quantum well layers are configured to have different well widths.

(6)
An active layer structure, including:
a first conductive layer having a current constriction structure, a current injection region being constricted in the current constriction structure;

a second conductive layer; and
an active layer provided between the first conductive layer and the second conductive layer, in which
the active layer includes a plurality of quantum well layers, a first light emission wavelength being in a wavelength range of an intensity peak of an entire light emission spectrum, the first light emission wavelength corresponding to a light emission recombination level energy gap of a first quantum well layer of the plurality of quantum well layers, the first quantum well layer being provided at a position closest to the current constriction structure.

(7)

A display apparatus, including:
a semiconductor light emitting element; and
an image generation unit that is capable of two-dimensionally scanning light emitted from the semiconductor light emitting element and controlling a brightness of the projected light on the basis of image data, in which
the semiconductor light emitting element includes
a first conductive layer having a current constriction structure, a current injection region being constricted in the current constriction structure,
a second conductive layer, and
an active layer provided between the first conductive layer and the second conductive layer, the active layer including a plurality of quantum well layers, a first light emission wavelength being in a wavelength range of an intensity peak of an entire light emission spectrum, the first light emission wavelength corresponding to a light emission recombination level energy gap of a first quantum well layer of the plurality of quantum well layers, the first quantum well layer being provided at a position closest to the current constriction structure.

REFERENCE SIGNS LIST 10 ridge portion
11 p-type electrode layer
12 n-type electrode layer
13 first conductive layer
14 second conductive layer
15 substrate
20b barrier layer
20a quantum well layer
20 active layer
20a (201, 202, 203) quantum well layer
32 current constriction structure
70 image generation unit
100 SLD
100G green light emission SLD
100B blue light emission SLD
102R red light emission SLD
200 display apparatus
201 first quantum well layer
202 second quantum well layer
203 third quantum well layer

The invention claimed is:
1. A semiconductor light emitting element, comprising:
a ridge portion that includes an electrode layer and a first cladding layer, wherein the electrode layer is on the first cladding layer;
a first conductive layer that includes:
a current constriction structure; and
a first guide layer, wherein
the ridge portion is in contact with the first guide layer, and
the current constriction structure includes a current injection region;
a second conductive layer; and
an active layer between the first conductive layer and the second conductive layer, wherein
the active layer comprises:
one of Aluminium Gallium Nitride (AlGaN) or Indium Gallium Nitride (InGaN), and
a plurality of first quantum well layers,
a first quantum well layer of the first plurality of first quantum well layers corresponds to a first light emission wavelength,
the first light emission wavelength is in a wavelength range of an intensity peak of an entire light emission spectrum of the semiconductor light emitting element,
the first light emission wavelength corresponds to a first light emission recombination level energy gap of the first quantum well layer, and
the first quantum well layer is closest to the current constriction structure than the plurality of first quantum well layers other than the first quantum well layer.

2. The semiconductor light emitting element according to claim 1, wherein the active layer further includes:
a second quantum well layer of the plurality of first quantum well layers, wherein
the second quantum well layer has a second light emission recombination level energy gap corresponding to a second light emission wavelength, and
the second light emission wavelength is greater than the first light emission wavelength; and
a third quantum well layer of the first plurality of first quantum well layers, wherein
the third quantum well layer has a third light emission recombination level energy gap corresponding to a third light emission wavelength, and
the third light emission wavelength is shorter than the first light emission wavelength.

3. The semiconductor light emitting element according to claim 2, wherein
the active layer further includes a plurality of second quantum well layers and a plurality of third quantum well layers,
the plurality of second quantum well layers has a first plurality of different light emission recombination level energy gaps,
the plurality of third quantum well layers has a second plurality of different light emission recombination level energy gaps,
the plurality of second quantum well layers and the plurality of third quantum well layers are alternately arranged in a direction away from the first quantum well layer,
a first plurality of light emission wavelengths corresponding to the first plurality of different light emission recombination level energy gaps of the plurality of second quantum well layers is arranged in ascending order from the first light emission wavelength in a spectrum diagram showing a relationship between the first plurality of light emission wavelengths and output, and
a second plurality of light emission wavelengths corresponding to the second plurality of different light emission recombination level energy gaps of the plurality of third quantum well layers is arranged in descending order from the first light emission wavelength in the spectrum diagram.

4. The semiconductor light emitting element according to claim 1, wherein a composition of the first quantum well layer is different from a composition of a second quantum well layer of the plurality of first quantum well layers.

5. The semiconductor light emitting element according to claim 1, wherein a well width of the first quantum well layer is different from a well width of a second quantum well layer of the plurality of first quantum well layers.

6. The semiconductor light emitting element according to claim 1, wherein
the second conductive layer includes a second cladding layer and a second guide layer, and
the second cladding layer is on the second guide layer.

7. An active layer structure, comprising:
a ridge portion that includes an electrode layer and a cladding layer, wherein the electrode layer is on the cladding layer;
a first conductive layer that includes:
a current constriction structure; and
a guide layer, wherein
the ridge portion is in contact with the guide layer, and
the current constriction structure includes a current injection region;
a second conductive layer; and
an active layer between the first conductive layer and the second conductive layer, wherein
the active layer comprises:
one of Aluminium Gallium Nitride (AlGaN) or Indium Gallium Nitride (InGaN), and
a plurality of quantum well layers,
a quantum well layer of the plurality of quantum well layers corresponds to a specific light emission wavelength,
the specific light emission wavelength is in a wavelength range of an intensity peak of an entire light emission spectrum of the active layer structure,
the specific light emission wavelength corresponds to a light emission recombination level energy gap of the quantum well layer, and
the quantum well layer is closest to the current constriction structure than the plurality of quantum well layers other than the quantum well layer.

8. A display apparatus, comprising:
a semiconductor light emitting element configured to emit light; and
an image generation unit configured to:
scan light emitted from the semiconductor light emitting element; and
control a brightness of a projection of the light, wherein
the semiconductor light emitting element includes:
a ridge portion that includes an electrode layer and a cladding layer,
wherein the electrode layer is on the cladding layer;
a first conductive layer that includes:
a current constriction structure; and
a guide layer, wherein
the ridge portion is in contact with the guide layer, and
the current constriction structure includes a current injection region;
a second conductive layer; and
an active layer between the first conductive layer and the second conductive layer, wherein
the active layer comprises:
one of Aluminium Gallium Nitride (AlGaN) or Indium Gallium Nitride (InGaN), and
a plurality of quantum well layers,
a quantum well layer of the plurality of quantum well layers corresponds to a specific light emission wavelength,
the specific light emission wavelength is in a wavelength range of an intensity peak of an entire light emission spectrum of the semiconductor light emitting element,
the specific light emission wavelength corresponds to a light emission recombination level energy gap of the quantum well layer, and
the quantum well layer is closest to the current constriction structure than the plurality of quantum well layers other than the quantum well layer.

* * * * *